United States Patent [19]
Rafla-Yuan et al.

[11] Patent Number: 5,961,852
[45] Date of Patent: Oct. 5, 1999

[54] LASER SCRIBE AND BREAK PROCESS

[75] Inventors: Howard C. Rafla-Yuan; Rick Bradley, both of Santa Rosa, Calif.

[73] Assignee: Optical Coating Laboratory, Inc., Santa Rosa, Calif.

[21] Appl. No.: 08/925,979

[22] Filed: Sep. 9, 1997

[51] Int. Cl.$^6$ .......................... B23K 26/00; H01L 31/042
[52] U.S. Cl. ...................................... 219/21.69; 136/256
[58] Field of Search .......................... 219/121.69, 121.67; 136/256, 258; 438/463; 428/428; 501/65; 225/2

[56] References Cited

U.S. PATENT DOCUMENTS

| | | | |
|---|---|---|---|
| 4,783,373 | 11/1988 | Baumeister et al. | 136/256 |
| 4,824,489 | 4/1989 | Cogan et al. | 136/256 |
| 4,877,481 | 10/1989 | Fukuda et al. | 219/121.69 |
| 4,915,743 | 4/1990 | Schilling | 136/256 |
| 4,937,129 | 6/1990 | Yamazaki | 428/428 |
| 5,019,176 | 5/1991 | Brandhorst, Jr. et al. | 136/256 |
| 5,214,261 | 5/1993 | Zappella | 219/121.67 |
| 5,219,801 | 6/1993 | Shorrock et al. | 501/65 |
| 5,348,589 | 9/1994 | Arai et al. | 136/258 |
| 5,449,413 | 9/1995 | Beauchamp et al. | 136/256 |
| 5,508,206 | 4/1996 | Glenn et al. | 136/256 |

OTHER PUBLICATIONS

"Optimization of Laser Scribing for Thin–Film Photo Voltares" by Compaan et al. in The Conference Record of the Twenty Fifth IEEE Photovoltaiz Specialists Conference—1996, pp. 769–772, May 1996.

Hare, David E.; Dlott, Dana D.; D'Amato, Richard J.; and, Lewis, Thomas E., "Pulse Duration Dependence for Laser Photohermal Imaging Media," IS&T's 50th Annual Conference, May, 1997, pp. 290–295.

"Electronic Display World," Aug. 1997, vol. 17, No. 8, p. 9.

*Primary Examiner*—Geoffrey S. Evans
*Attorney, Agent, or Firm*—Workman, Nydegger & Seeley

[57] ABSTRACT

A method for effectuating scribe and break of coated glass microsheets for use with satellite solar cell covers. The method improves the consistency and edge quality of scribed solar cell covers, and also adds scribe and break capabilities not available with the conventional processes, resulting in various, even complex shapes and improved yields. The laser scribe method ensures that most of the laser energy is absorbed in a thin layer that is removed during the pulse, which further ensures that virtually no heat is left behind. This method also promotes a superior and consistent edge quality in satellite solar cell covers. The smoother edges eliminate points of weakness from where cracks may originate, as frequently experienced with the conventional diamond scribe techniques. A laser source such as a KrF excimer laser is utilized for scribing the microsheets. The absorption of the laser correlates with the particular properties of the coating contained on the surface of the microsheets and the particular properties of the microsheet itself. The microsheets are broken to their final size by applying a tensile force perpendicular to the scribe line.

30 Claims, 1 Drawing Sheet

LASER SCRIBE AND BREAK PROCESS

BACKGROUND OF THE INVENTION

1. The Field of the Invention

The present invention is directed generally to methods and apparatus for scribing and breaking substrates, and more specifically to methods and apparatus for scribing and breaking microsheets of glass.

2. The Relevant Technology

Thin sheets of glass, typically called "microsheets," consist of a ribbon of glass with a uniform thickness over the central region and small beads of thicker material at the edges. The edges provide some rigidity for handling but must be cut off before use of the microsheet.

One important use of microsheets is as covers for satellite solar cells. Microsheets suitable for this purpose typically comprise a borosilicate composition doped with cerium. In addition, such microsheets are commonly coated with single or multilayer thin films to effectuate certain thermal or optical characteristics. For example, in order to create a surface that reflects ultraviolet and infrared light wavelengths, microsheets for use with satellite solar cell covers are often coated with thin films of $Ta_2O_5$ and $SiO_2$. These thin films help control the thermal properties of the satellite solar cell covers, thus preventing the solar cells from heating up excessively.

Microsheets of glass used with satellite solar cell covers must be cut to fit the particular shape of the satellite solar cell. Such microsheets commonly range from about 50 microns to about 150 microns in thickness. In order to secure an appropriate fit, the microsheets are typically scribed and then broken along the scribe line. The critical depth for a scribe in such a microsheet via conventional techniques is from about 15% to about 20% of the microsheet's thickness. Hence, the critical scribe depth will generally fall in the narrow range from about 8 to about 30 microns. Even minor deviations in scribe depth will result in scribes that do not break properly. This is particularly problematic because the glass tends to break elsewhere and not along the scribe line if the scribe is too shallow, and if the scribe is too deep, the resulting edges are so rough that they render the microsheet useless.

The conventional material utilized for scribing purposes is a fresh, natural diamond. During use, the diamond cutting surface undergoes wear, causing its scribing capabilities to deteriorate. In order to achieve an adequate scribe depth, the pressure on the diamond scribe must be ever-increasing to counteract the wearing of the diamond.

Unfortunately, it is not a simple matter to discern the wear on the scribing diamond. Instead, the degradation of the diamond demands an operator to physically shut down the system and individually inspect each diamond, which results in increased costs and production delays due to the inspection time. All too often, the inspection is inadequate or untimely, resulting in undesirable glass breakage due to ineffective scribe depth.

Furthermore, because the wear on the diamond is difficult to ascertain and control, it is particularly difficult to obtain and maintain the critical scribe depth. Cuts made by the diamond scribe must be monitored very closely, again resulting in increased expense.

In addition, as the diamond degrades, the scribed edges of the microsheet decline in quality. Cracks tend to propagate along the rough, diamond-chipped edges and the microsheets tend to weaken. As a result, the microsheet may break during the process of bonding it on the solar cell.

Diamond scribes confront additional difficulties when faced with scribing microsheets coated with certain reflective thin films. For example, scribing through red-reflective layers, which are typically three times thicker than other reflective layers, tends to be problematic for diamond scribes. The stress in the thicker red-reflective layers makes the microsheet more difficult to cut and results in a drastically reduced yield of such coated microsheets when diamond scribes are utilized.

SUMMARY AND OBJECTS OF THE INVENTION

It is therefore a primary object of the present invention to provide improved methods and apparatus for effectuating scribe and break of glass microsheets.

Another object of the present invention is to provide methods and apparatus for scribe and break which achieve an appropriate fit of glass microsheets on satellite solar cell covers.

Still another object of the present invention is to provide methods and apparatus for scribe and break which facilitate production of various shapes and sizes of glass microsheets.

Yet another object of the present invention is to provide methods and apparatus for scribe and break which offer significant control over the critical scribe depth.

It is still another object of the present invention to provide methods and apparatus for scribe and break which eliminate the inspection time and the wasted microsheets of conventional methods.

It is yet another object of the present invention to provide methods and apparatus which facilitate scribe and break of coated microsheets.

Another object of the present invention is to provide methods and apparatus which diminish the tendency of cracks to propagate along the edges of the microsheet.

Still another object of the present invention is to provide methods and apparatus for scribe and break which increase the yield of usable microsheets.

These and other objects and features of the present invention will become more fully apparent from the following description and appended claims, or may be learned by the practice of the invention as set forth hereinafter.

The present invention is directed to new and improved methods and apparatus for effectuating scribe and break of coated glass microsheets, such as for use with satellite solar cell covers. The method of the present invention improves the consistency and edge quality of scribed solar cell covers, and also adds scribe and break capabilities not available with the conventional processes, resulting in various, even complex shapes and improved yields.

The laser scribe method of the present invention ensures that most of the laser energy is absorbed in a thin layer that is removed during the pulse, which further ensures that virtually no heat is left behind. The absorption of the laser energy correlates with the particular properties of the coating contained on the surface of the microsheets and the particular properties of the microsheet itself.

The laser scribe method also promotes a superior and consistent edge quality in satellite solar cell covers. The smoother edges eliminate points of weakness from where cracks may originate, as frequently experienced with the conventional diamond scribe techniques.

A laser source, such as a KrF excimer laser, is utilized for scribing the microsheets. It is a feature of the present invention that the scribe depth can be consistently controlled with the use of a laser, thus eliminating the critical scribe depth problems of the conventional diamond techniques. Multiple pulses of the laser are preferably utilized to attain the desired scribe depth. The microsheets are broken to their final size by applying a tensile force perpendicular to the scribe line.

BRIEF DESCRIPTION OF THE DRAWINGS

In order to more fully understand the manner in which the above-recited and other advantages and objects of the invention are obtained, a more particular description of the invention will be rendered by reference to a specific embodiment thereof which is illustrated in the appended drawings. Understanding that these drawings depict only a typical embodiment of the invention and are not therefore to be considered to be limiting of its scope, the invention in its presently understood best mode for making and using the same will be described and explained with additional specificity and detail through the use of the accompanying drawings in which.

DETAILED DESCRIPTION OF THE PREFERRED EMBODIMENTS

Figure 1:
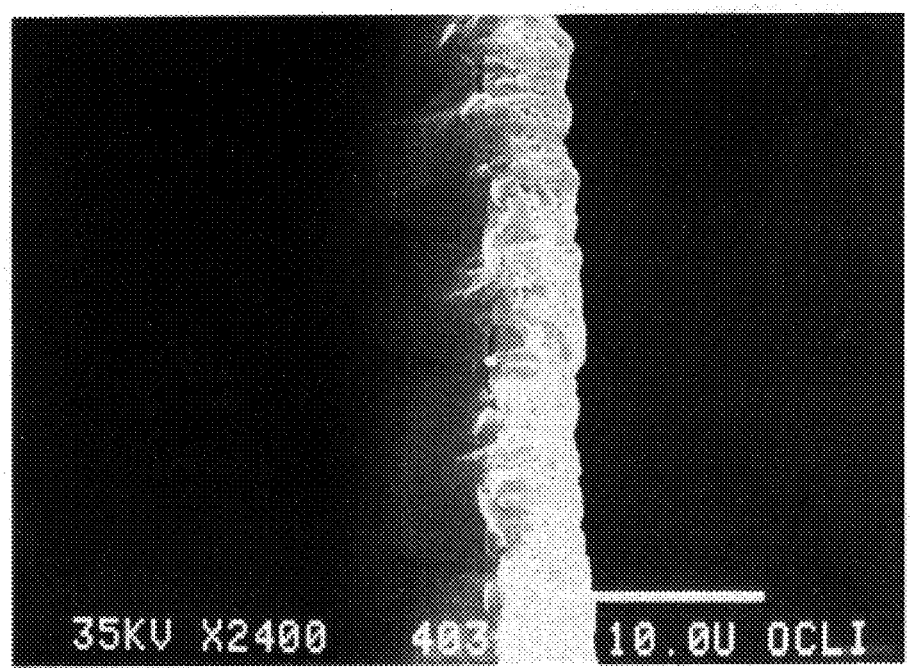
FIG. 1 is a scanning electron micrograph of the edge of a microsheet scribed in accordance with the present invention.

The present invention is directed to new and improved methods and apparatus for effectuating scribe and break of coated glass microsheets. For purposes of brevity and simplicity, the following discussion will be limited to microsheets for use with satellite solar cells, but it should be understood as applicable to all glass microsheets.

Satellite solar cell covers are commonly formed from glass microsheets, such as cerium doped borosilicate microsheets, and are usually about 50 microns to about 150 microns in thickness. In order to cut and shape the microsheets, various scribing techniques conventionally have been utilized. It is a characteristic of the microsheets that in order to generate an effective edge via conventional techniques, scribing should extend between about 15% to about 20% of the thickness of the microsheet. If the scribe is too shallow, the microsheets break along other directions rather than the scribe line, or if the scribe is too deep, rough edges result which render the microsheets useless. It should be appreciated that a microsheet thickness and a critical scribe depth, both measured in microns, permit little room for error.

Conventionally, microsheets have been configured for use as satellite solar cell covers by scribing them with diamond scribes or diamond blade saws, and then applying pressure to break the glass. However, in practice, diamonds have demonstrated substantial difficulties. For example, thin film coated microsheets cannot be scribed consistently with diamonds. In addition, as diamond scribes become worn, it becomes difficult to control the resulting scribe depth. As described above, the scribe depth requires precision of mere microns. Worn diamonds commonly scribe either too deep or too shallow, and thus produce microsheets virtually worthless for solar cell cover applications.

The present invention solves the problems encountered by the conventional diamond scribe techniques. The method of the present invention improves the consistency and edge quality of scribed solar cell covers, and also adds scribe and break capabilities not available with the conventional processes, resulting in various, even complex shapes and improved yields.

Prior to the present invention it had been believed that lasers would be ineffective for use in the scribe and break of glass microsheets It was believed that lasers would introduce heat, which would delaminate coatings and damage the substrate. Thus, it has heretofore been unheard of to use lasers for scribing and breaking of glass microsheets, especially for solar cell covers.

However, it has been discovered as a feature of the present invention that certain parameters of laser usage can be optimized so that virtually no heat is generated and an effective scribe line is formed. Specifically, it has been discovered that a 248 nm laser light is strongly absorbed by a glass microsheet, which significantly limits the optical penetration into the glass and concentrates the energy in a small volume. In addition, a short laser pulse duration (tens of nanoseconds) limits the distance the laser deposited heat can travel.

The laser scribe method of the present invention promotes a superior and consistent edge quality in satellite solar cell covers. The smoother edges eliminate points of weakness from where cracks may originate, as frequently experienced with the conventional diamond scribe techniques. Furthermore, it is a feature of the present invention that the scribe depth can be consistently controlled with the use of a laser, thus eliminating the critical scribe depth problems of the conventional diamond techniques.

The method of the present invention preferably includes the following steps. First, an appropriate laser source is obtained. For example, a laser with a wavelength with a strong absorption for the desired substrate can be utilized. The optical absorption of the material is a function of the laser wavelength and material to be ablated. To determine if a material is a suitable candidate for laser ablation, one must have a material with strong absorption at an appropriate laser wavelength. Ultraviolet lasers are preferable because most materials have strong absorption in the ultraviolet range.

The table below illustrates the available lasing wavelengths of several types of high powered lasers. It has been determined, based on the measured optical properties of uncoated glass microsheets, that glass microsheets exhibit strong absorption below 300 nm and also above 10600 nm. Therefore, the excimer, the YAG (yttrium aluminum garnet) fourth and fifth harmonics, and the $CO_2$ lasers could be utilized to scribe glass microsheets in accordance with the present invention. In view of the teachings herein, it is conceivable that any laser source which generates a wavelength which is strongly absorbed by the glass microsheets, that is, any laser with a wavelength below 300 nm or above 10600, could be utilized.

TABLE 1

| LASER CLASS | LASER TYPE | LASER WAVELENGTH |
|---|---|---|
| Excimer (Gas) | $F_2$ | 157 nm |
| | ArF | 193 nm |
| | KrF | 248 nm |
| | XeCl | 308 nm |
| YAG (Solid State) | Fundamental Frequency | 1064 nm |
| | Second Harmonic | 532 nm |
| | Third Harmonic | 355 nm |
| | Fourth Harmonic | 266 nm |

TABLE 1-continued

| LASER CLASS | LASER TYPE | LASER WAVELENGTH |
|---|---|---|
| | Fifth Harmonic | 212 nm |
| $CO_2$ (Gas) | $CO_2$ | 10600 nm |
| CO (Gas) | CO | 5000 nm |

In a preferred embodiment of the present invention, a laser which has a wavelength which is strongly absorbed by the glass, such as a KrF excimer laser, is utilized. The KrF excimer laser generates a wavelength of about 248 nm and an output energy of about 2.2 $J/cm^2$. There is a strong absorption of the 248 nm laser light by the glass microsheet, which significantly limits the optical penetration into the material and concentrates the deposited energy in a small volume. Although this laser generates the preferred wavelength and energy levels, it should be realized that other wavelength and energy variations would be within the scope of the present invention.

Multiple pulses of the laser are preferably utilized to attain a desired scribe depth in the microsheet. For each desired substrate, the critical scribe depth can be easily and readily determined with the use of a laser. Unlike the conventional methods, the critical scribe depth is not limited to a range from about 15% to about 20% of the total thickness of the microsheet. To the contrary, it is a feature of the present invention that the critical scribe depth can be less than 1% or greater than 20% of the total thicknes of the microsheet. Further, it is a feature of the present invention that the laser method offers precise control such that the desired scribe depth can be repeatedly and consistently achieved.

Another critical feature of the present invention is that the laser produces a pulse which is sufficiently short so as to avoid generation of excessive heat. A preferred short pulse duration is no longer than tens of nanoseconds, which limits the distance the laser deposited heat can travel. It has been discovered that the heat transport away from the irradiated area begins at the onset of laser heating and is thus reduced with short pulsed lasers, thereby limiting thermal damage in the unablated areas. The following expression describes one dimensional heat transport in materials:

$$L_{th} = \sqrt{2\kappa\tau}$$

where $\kappa$ is the thermal diffusivity of the irradiated material, $\tau$ is the laser pulse duration, and $L_{th}$ is the distance into the material that equals 1/e of the surface temperature.

The KrF excimer laser has a desired pulse duration ($\tau$) of less than tens of nanoseconds, which limits the distance any laser-deposited heat can travel in the glass microsheet. Although a KrF excimer laser is preferred, it should be appreciated that other lasers would fall within the scope of the present invention. For example, a short pulse $CO_2$ laser may generate an appropriate pulse for the method of the present invention.

It is a feature of the present invention that most of the laser energy is absorbed in a thin layer of the microsheets that is removed during the pulse, ensuring that virtually no heat is left behind. The absorption directly correlates with the particular properties of the coating contained on the surface of the microsheets and the particular properties of the microsheet itself. For example, the preferred microsheets are coated on each side with blue and red reflective multilayer dielectric thin films comprising $Ta_2O_5$ and $SiO_2$. Further, the microsheets preferably contain a small amount of cerium oxide, which increases the ultraviolet absorptance of the microsheet and significantly improves its resistance to yellowing caused by radiation of ultraviolet light.

It should be appreciated, however, that other coatings may be utilized to effectuate various reflective, anti-reflective, and/or absorptive characteristics on the surface of the microsheets or otherwise. For example, a microsheet, alternatively or additionally, may be coated with a thin film that is anti-reflective with respect to visible light.

The microsheets are broken to their final size by applying a tensile force perpendicular to the laser scribe line. In a preferred embodiment of the present invention, a suitable tensile force is accomplished by manually bending the microsheet along the scribe line. It should be appreciated that a microsheet may be broken to its final size via any suitable force applied to the scribe line.

Figure 2:
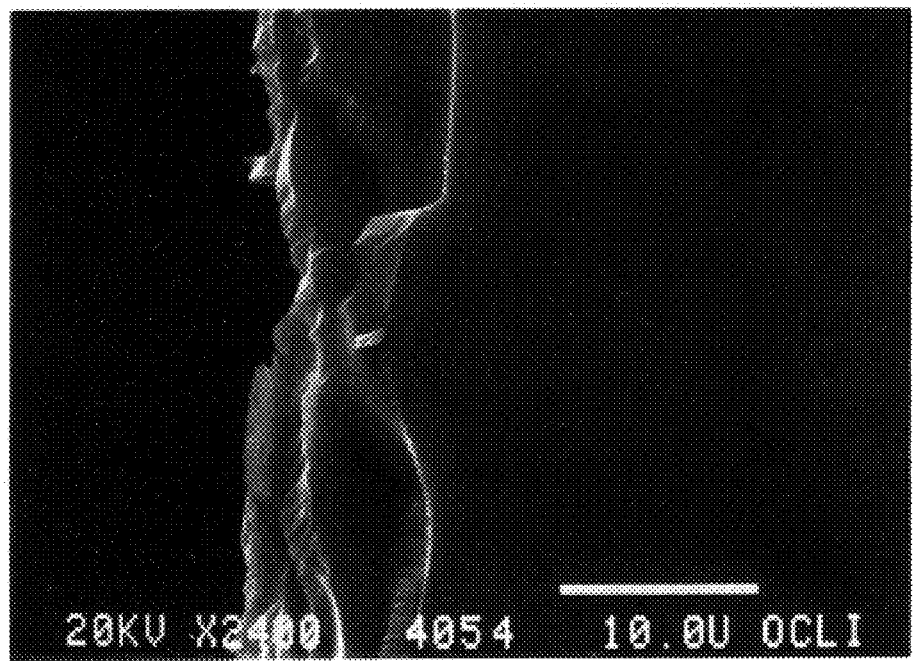
FIG. 2 is a scanning electron micrograph of the edge of a microsheet scribed in accordance with a conventional method.

FIG. 1 illustrates the superior edge quality of a microsheet produced with the laser scribe of the present invention. FIG. 2, on the other hand, illustrates the jagged edge of a microsheet produced with a diamond scribe. The edge of the microsheet from FIG. 1, being significantly smoother than the jagged edge of the convention microsheet from FIG. 2, substantially eliminates points of weakness from where cracks may originate in the scribe microsheet.

EXAMPLE

Ten pieces of solar cell covers, (7.87 cm×2.54 cm each) were produced with a 248 nm pulsed KrF excimer laser. The solar cell covers consisted of cerium doped borosilicate microsheets with a blue reflecting coating on one side and a red reflective coating on the other side. These red and blue reflecting layers were multi-layer dielectric films of $Ta_2O_5$ and $SiO_2$. The blue reflecting layer was coated with a thickness of 0.7 $\mu$m and the red reflecting layer was three times thicker than the blue coating, thus about 2.1 $\mu$m in thickness. The laser beam size was set to $4\times10^{-6}$ $cm^2$ (20 $\mu$m×20 $\mu$m). The energy density of the beam was 11 $J/cm^2$-pulse. After a laser exposure of 60 pulses, the scribing depth was approximately 1 $\mu$m. Five solar cell covers were laser scribed from the blue reflecting side and the other five were laser scribed from the red reflecting side. The microsheets were broken to their final size by applying a tensile force perpendicular to the scribe line. The edges produced were substantially smooth and even, and no significant difference in edge quality was observed between the ten solar cell covers.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of scribing and breaking microsheets comprising the steps of:

a. obtaining a microsheet of glass of a predetermined physical thickness;

b. obtaining a laser source capable of producing a wavelength which is strongly absorbed by the glass, said laser source being capable of generating at least one pulse sufficiently short in time so as to avoid damaging said microsheet by generation of excessive heat;

c. scribing said microsheet with said laser source to a predetermined depth in said microsheet to form one or more scribe lines; and d. breaking said microsheet along the one or more scribe lines.

2. A method according to claim 1, wherein said microsheet is doped with a material with strong absorption at the wavelength of said laser source.

3. A method according to claim 1, wherein said microsheet comprises borosilicate.

4. A method according to claim 1, wherein said microsheet is doped with cerium.

5. A method according to claim 1, wherein said laser source comprises an excimer laser.

6. A method according to claim 1, wherein said laser source comprises a KrF excimer laser.

7. A method according to claim 1, wherein said laser source generates a wavelength of about 248 nanometers.

8. A method according to claim 1, wherein said laser source generates an output energy of about 2.2 J/cm$^2$-pulse.

9. A method according to claim 1, wherein said predetermined scribe depth is obtained utilizing a plurality of pulses of said laser source, each of said plurality of pulses being sufficiently short in time so as to avoid generating excessive heat.

10. A method according to claim 1, wherein said microsheet is coated with at least one reflective thin film coating on at least one side of the microsheet.

11. A method according to claim 10, wherein said at least one reflective thin film coating comprises at least one red reflective coating.

12. A method according to claim 10, wherein said at least one reflective thin film coating comprises at least one blue reflective coating.

13. A method according to claim 10, wherein said at least one reflective thin film coating comprises $Ta_2O_5$.

14. A method according to claim 10, wherein said at least one reflective thin film coating comprises $SiO_2$.

15. A method according to claim 10, wherein said at least one reflective thin film coating comprises $SiO_2$ and $Ta_2O_5$.

16. A method according to claim 1, wherein said microsheet is coated on at least one side with at least one thin film coating which is anti-reflective for visible light.

17. A method according to claim 1, wherein said microsheet is coated on at least one side with at least one thin film coating which is anti-reflective for visible light, and said microsheet is coated on at least one side with at least one reflective thin film coating.

18. A method according to claim 1, wherein the step of breaking said microsheet includes applying a force to said microsheet such that the resulting edges of the broken microsheet are smooth and substantially lack points of weakness from where cracks may originate.

19. A glass cover microsheet formed by scribing a microsheet of glass having a predetermined physical thickness to a predetermined depth using a laser to form one or more scribe lines, and breaking the microsheet of glass along the one or more scribe lines such that the resulting edges of the scribed and broken microsheet of glass are smooth and substantially lack points of weakness from where cracks may originate.

20. A microsheet as recited in claim 19, wherein said microsheet is doped with cerium.

21. A microsheet as recited in claim 19, wherein said microsheet comprises borosilicate.

22. A microsheet as recited in claim 19, wherein said microsheet further comprises at least one surface coated with a dielectric.

23. A microsheet according to claim 19, wherein said microsheet is coated with at least one reflective thin film coating on at least one side of the microsheet.

24. A microsheet according to claim 23, wherein said at least one reflective thin film coating comprises at least one red reflective coating.

25. A microsheet according to claim 23, wherein said at least one reflective thin film coating comprises at least one blue reflective coating.

26. A microsheet according to claim 23, wherein said at least one reflective thin film coating comprises $Ta_2O_5$.

27. A microsheet according to claim 23, wherein said at least one reflective thin film coating comprises $SiO_2$.

28. A microsheet according to claim 23, wherein said at least one reflective thin film coating comprises $SiO_2$ and $Ta_2O_5$.

29. A microsheet according to claim 19, wherein said microsheet is coated on at least one side with at least one thin film coating which is anti-reflective for visible light.

30. A microsheet according to claim 19, wherein said microsheet is coated on at least one side with at least one thin film coating which is anti-reflective for visible light, and said microsheet is coated on at least one side with at least one reflective thin film coating.

* * * * *

UNITED STATES PATENT AND TRADEMARK OFFICE
CERTIFICATE OF CORRECTION

PATENT NO. : 5,961,852
DATED : Oct. 5, 1999
INVENTOR(S) : Howard C. Rafla-Yuan; Rick Bradley It is certified that error appears in the above-identified patent and that said Letters Patent is hereby corrected as shown below:

Cover Page, Other Publications, lines 1 and 2, change "Photo Voltares" to
--Photovoltaics--

Cover Page, Other Publications, line 3, change "Photovoltaiz" to
--Photovoltaics--

Signed and Sealed this

Twenty-sixth Day of September, 2000

*Attest:*

Q. TODD DICKINSON

*Attesting Officer*      *Director of Patents and Trademarks*